United States Patent
Bookhardt et al.

(10) Patent No.: US 6,328,097 B1
(45) Date of Patent: Dec. 11, 2001

(54) INTEGRATED HEAT DISSIPATION APPARATUS

(75) Inventors: Gary L. Bookhardt, Aloha; Shawn S. McEuen, Hillsboro, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/608,820

(22) Filed: Jun. 30, 2000

(51) Int. Cl.[7] ................................................ F28D 15/00
(52) U.S. Cl. ................................. 165/104.33; 165/80.3; 174/16.3; 361/700; 361/687; 361/695; 361/702; 257/715; 257/719
(58) Field of Search .................... 165/80.3, 185, 165/104.33, 104.26; 257/714, 715, 719; 174/16.3, 15.2; 361/699, 700, 687, 702

(56) References Cited

U.S. PATENT DOCUMENTS

| | | | |
|---|---|---|---|
| 5,690,468 | * 11/1997 | Hong | 165/80.3 |
| 5,959,837 | * 9/1999 | Yu | 361/697 |
| 6,049,455 | * 4/2000 | Nakamura et al. | 165/80.3 |
| 6,105,662 | * 8/2000 | Suzuki | 165/104.33 |
| 6,122,169 | * 9/2000 | Liu et al. | 361/700 |
| 6,137,681 | * 10/2000 | Lu | 361/697 |
| 6,166,906 | * 12/2000 | Sun et al. | 174/16.3 |

* cited by examiner

Primary Examiner—Ira S. Lazarus
Assistant Examiner—Terrell McKinnon
(74) Attorney, Agent, or Firm—Blakely, Sokoloff, Taylor & Zafman LLP

(57) ABSTRACT

An integrated heat dissipation apparatus includes an attachment area, a heat exchange area thermally connected to the attachment area, and an air flow generation area that is integrally formed with the attachment area and the heat exchange area. A thermally conductive member extends between the attachment area and the heat exchange area to facilitate the removal of heat from the attachment area to the heat exchange area. A generated air flow passes through the heat exchange area.

4 Claims, 2 Drawing Sheets

INTEGRATED HEAT DISSIPATION APPARATUS

BACKGROUND OF THE INVENTION

1. Field of the Invention

The present invention relates to heat dissipation devices for computer systems.

2. Background Information

A computer system often has a number of components that generate heat as the computer system remains powered. For example, a central processing unit (CPU) is capable of generating enough heat to potentially affect its performance if the heat is not adequately dissipated. Furthermore, an inadequate dissipation of the heat generated by a component may lead to a build-up of heat that can affect neighboring components as well as the component itself.

Natural convection is generally not considered to be an effective solution to the problem of excessive heat generation because many of the heat generating components of conventional computer systems, particularly the CPU, are completely enclosed by a main housing. Thus, forced convection is typically used to help dissipate the heat generated by a computer system's internal components. Specifically, it is well known in the art to use one or more fans located on an exposed side of a CPU to help dissipate the heat generated by the CPU. Such fans are often used in conjunction with a heat sink which spreads heat among its surface area to provide more efficient heat dissipation. In a typical computer system having a socketed CPU, a fan is located on top of a heat sink, which is in thermal contact with a top surface (the backside) of a CPU. The fan typically draws in air from an inlet that is facing away from the CPU.

Heat dissipation is a particularly important requirement for portable personal computers because they are becoming smaller and thinner. The cramped area within the housing of a portable personal computer can lead to a more rapid build up of heat. Furthermore, the lack of available space within a portable personal computer places further limitations on the size and shape of useable heat dissipation devices.

BRIEF DESCRIPTION OF THE DRAWINGS

Various embodiments of the present invention will be described in detail with reference to the following drawings. The present invention is illustrated by way of example and not limitation in the accompanying figures.

DETAILED DESCRIPTION

The following description provides embodiments of the present invention. However, it will be appreciated that other embodiments of the present invention will become apparent to those of ordinary skill in the art upon examination of this description. Thus, the present description and accompanying drawings are for purposes of illustration and are not to be used to construe the invention in a restrictive manner.

In one embodiment of the present invention, a heat dissipation apparatus includes an integrated heat sink having several continuously formed areas. Such areas may include an attachment area for attaching the integrated heat sink to a heat producing component, a heat exchange area which is thermally coupled to the attachment area, and an air flow generation area which is integrally formed with the attachment area and the heat exchange area. The attachment area has a contour that complements the exposed surface of the heat producing element such that a more secure fit can be achieved between the attachment area and the heat producing element. The attachment area, heat exchange area and air flow generation area share a common surface of the integrated heat sink to form a thin profile heat dissipation device. Such a thin profile device is particularly useful in portable personal computers, in which space is limited.

Figure 1A:
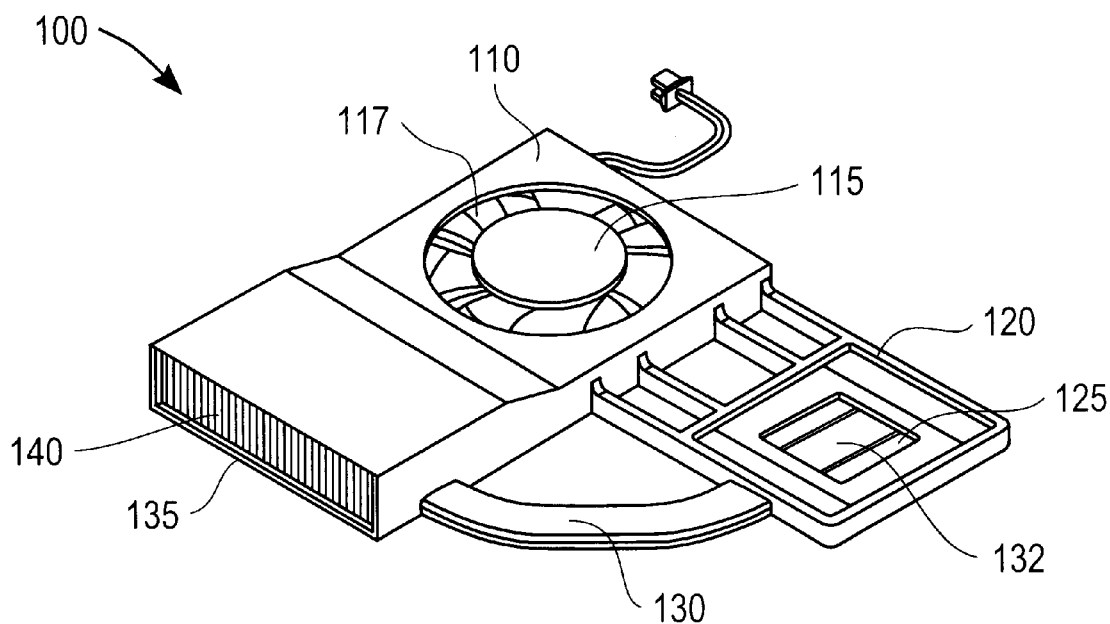
FIG. 1A illustrates a perspective view of a heat dissipation apparatus in accordance with the teachings of the present invention.

FIG. 1A illustrates a perspective view of one embodiment of a heat dissipation apparatus 100 according to the present invention. Apparatus 100 is an integrated heat sink having several distinct areas. An air flow generation area includes a housing 110 having a fan 115, which is shown as a conventional rotary fan, but may be any fan which can generate and direct an air flow toward heat exchanger 135. Air may be drawn into housing 110 through an inlet 117 in housing 110.

An attachment area includes a thermal attachment block 120 which is formed with a through hole 125. Thermal attachment block 120 may be formed of any suitable thermally conductive material. Thermal attachment block 120 is integrally formed with housing 110 and has a contoured recess to accommodate and mate with a heat producing component. It is appreciated that thermal attachment block 120 may have a recess that is contoured in any of a variety of ways depending on the shape of the heat producing component over which thermal attachment block 120 is placed.

A heat exchange area includes heat exchanger 135 having a series of spaced apart fins 140. Heat exchanger 135 is integrally formed with housing 110. Heat exchanger 135 is hollow to permit the air flow generated by fan 115 to pass from housing 110 to heat exchanger 135. The air flow exits heat exchanger 135 by passing through the gaps between adjacent fins 140.

A thermally conductive member 130 (e.g. a heat pipe) extends between thermal attachment block 120 and heat exchanger 135 to provide a thermal path from thermal attachment block 120 to heat exchanger 135. An end portion 132 of member 130 extends over through hole 125 such that it is accessible from through hole 125.

Although integrated heat sink 100 is shown in an L-shaped configuration, it should be noted that the present invention is not restricted to such a configuration. For example, integrated heat sink 100 may have a linear configuration in which the distinct areas of integrated heat sink 100 are in series. It is important to note that the distinct areas of integrated heat sink 100 are substantially planar. Such planarity provides integrated heat sink 100 with a thin profile, which allows integrated heat sink 100 to be used in compact areas.

Figure 1B:
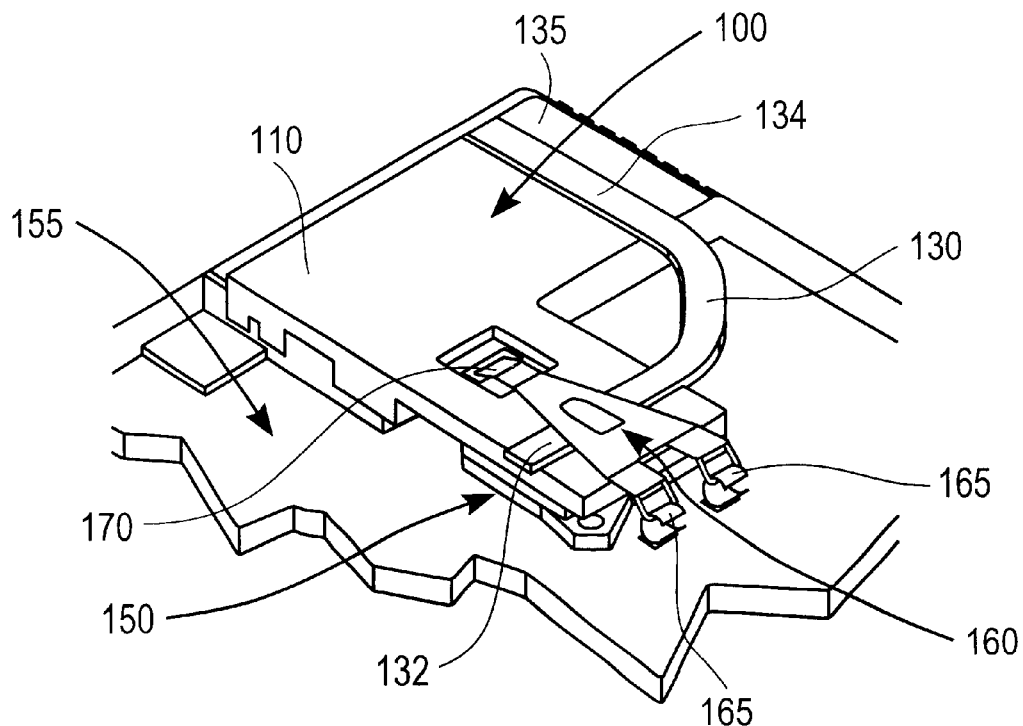
FIG. 1B illustrates a perspective view of the heat dissipation apparatus of FIG. 1A attached to a heat producing component in accordance with the teachings of the present invention.

FIG. 1B illustrates a perspective view of integrated heat sink 100 attached to a heat producing component 150, which is attached to a substrate 155 (e.g. a printed circuit board). Integrated heat sink 100 is turned over from the orientation shown in FIG. 1A such that inlet 117 faces substrate 155. Thus, when attachment block 120 is placed over and mated with heat producing component 150 (e.g. a CPU), fan 115 is in a position to draw in air from the side of integrated heat sink 100 facing substrate 155. Fan 115 may be powered by any suitable means.

A securing clip 160 helps maintain contact between attachment block 120 and heat producing component 150. Specifically, securing clip 160 clamps down on attachment block 120 by engaging a notch 170 in integrated heat sink 100 and hooks 165 which are coupled to substrate 155. Because securing clip 160 is disposed over end portion 132 of thermally conductive member 130, the exposed area of end portion 132 is pressed against a top surface of heat producing component 150 via through hole 125. Thus, direct thermal contact may be maintained between end portion 132 and heat producing component 150 to facilitate the transfer of heat from heat producing component 150 to heat exchanger 135. Other securing devices may be used in addition to clip 160 to ensure an adequate coupling of integrated heat sink 100 to heat producing component 150 and/or substrate 155.

In the embodiment of the present invention shown in FIG. 1B, end portions 132 and 134 of thermally conductive member 130 are embedded in attachment block 120 and heat exchanger 135, respectively, such that they are flush with the top surfaces of attachment block 120 and heat exchanger 135. The top surfaces of attachment block 120, housing 110 and heat exchanger 135, as viewed in the orientation shown in FIG. 1B, share a common, continuous surface of integrated heat sink 100. Thus, attachment block 120, housing 110 and heat exchanger 135 are substantially parallel to substrate 155 when attachment block 120 is placed over heat producing component 150. Furthermore, attachment block 120, housing 110 and heat exchanger 135 may be viewed as forming a single unit. End portions 132 and 134 extend entirely across attachment block 120 and heat exchanger 135, respectively, to increase the surface area available for heat transfer and removal. Some of the heat carried by end portion 134 may spread to the surfaces of heat exchanger 135 and fins 140 and then dissipated by the air flow generated by fan 115.

Figure 2:
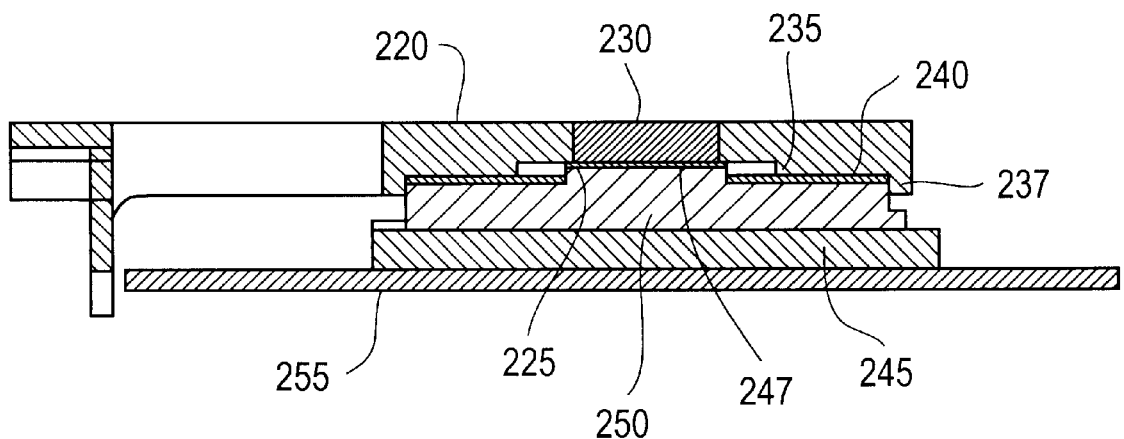
FIG. 2 illustrates a cross-sectional view of an attachment portion of a heat dissipation apparatus attached to a heat producing component in accordance with the teachings of the present invention.

FIG. 2 illustrates a cross-sectional view of an attachment block 220 placed over a CPU 250. Attachment block 220 may be part of an integrated heat sink similar to that previously described with respect to FIGS. 1A and 1B. CPU 250 is located in a socket 245 coupled to a printed circuit board 255. A heat pipe 230 extending across attachment block 220 is in direct thermal contact with a top surface 247 of CPU 250. Heat pipe 230 is embedded in attachment block 220 and is accessible via a through hole 225 in attachment block 220. Because heat pipe 230 can be contacted directly via through hole 225, unnecessary thermal interfaces are eliminated and heat pipe 230 may operate more effectively.

Attachment block 220 has a contoured recess to accommodate CPU 250 and provide a more secure fit between attachment block 220 and CPU 250. A stepped surface 235 of the contoured recess makes contact with surface 240 of CPU 250. Because stepped surface 235 is supported by surface 240 of CPU 250, attachment block 220 may be prevented from tilting, and the amount of compression exerted by heat pipe 230 against top surface 247 of CPU 250 may be controlled. A ridge 237 extends from attachment block 220 and borders the perimeter of CPU 250 to limit the lateral movement of attachment block 220 relative to CPU 250. Thus, the contoured recess of attachment block 220 complements the shape and surface of CPU 250 to help ensure a secure fit between attachment block 220 and CPU 250.

Attachment block 220 may be secured to printed circuit board 255 and/or socket 245 by any suitable means which can apply enough of a downward force to attachment block 220 to maintain contact between attachment block 220 and CPU 250. It is particularly beneficial to maintain contact between heat pipe 230 and top surface 247 of CPU 250.

In the foregoing detailed description, the apparatus and method of the present invention have been described with reference to specific exemplary embodiments. However, it will be evident that various modifications and changes may be made without departing from the broader scope and spirit of the present invention. The present specification and figures are accordingly to be regarded as illustrative rather than restrictive.

What is claimed is:

1. A heat dissipation apparatus for a central processing unit on a substrate, comprising:
   an attachment block for positioning on the central processing unit and having a contoured recess to mate with a periphery of the central processing unit and a through hole down into the contoured recess;
   a fan housing secured to said attachment block;
   a fan that draws air into said fan housing;
   a heat exchanger secured to said fan housing and having a plurality of spaced apart fins defining a plurality of air channels through which the air is expelled from the fan housing;
   a heat pipe having a first end over said through hole of said attachment block and a second end secured to said heat exchanger; and
   a spring clip having a notch over the first end of said heat pipe and depressing said first end onto the central processing unit.

2. The heat dissipation apparatus of claim 1 wherein said attachment block has a first surface and said heat sink has a second surface, wherein said first and second surfaces are substantially planar relative to each other.

3. The heat dissipation apparatus of claim 2 wherein said first end of said heat pipe is embedded in said attachment block and said second end of said heat pipe is embedded in said heat exchanger, and wherein said heat pipe has a third surface substantially level with said first and second surfaces.

4. The heat dissipation apparatus of claim 2 wherein said fan housing has a third surface, said first and second surfaces contacting said substrate and a gap being defined between said substrate and said third surface about said fan.

* * * * *